United States Patent
Inuzuka

(10) Patent No.: US 11,340,061 B2
(45) Date of Patent: May 24, 2022

(54) MEASURING DEVICE AND MEASURING METHOD

(71) Applicant: SHARP KABUSHIKI KAISHA, Osaka (JP)

(72) Inventor: Masahiro Inuzuka, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/981,658

(22) PCT Filed: Mar. 26, 2018

(86) PCT No.: PCT/JP2018/012065
§ 371 (c)(1),
(2) Date: Sep. 16, 2020

(87) PCT Pub. No.: WO2019/186630
PCT Pub. Date: Oct. 3, 2019

(65) Prior Publication Data
US 2021/0108912 A1    Apr. 15, 2021

(51) Int. Cl.
*G01B 11/24* (2006.01)
(52) U.S. Cl.
CPC .................... *G01B 11/24* (2013.01)
(58) Field of Classification Search
CPC ......... G01B 11/24; H01L 27/32; H01L 51/50; H05B 33/10

USPC ..... 356/600–640, 237.1–237.6, 239.1–239.8
See application file for complete search history.

(56) References Cited

U.S. PATENT DOCUMENTS

| | | | |
|---|---|---|---|
| 5,880,828 A * | 3/1999 | Nakamura | G01N 21/94 |
| | | | 356/237.3 |
| 9,580,791 B2 * | 2/2017 | Inoue | C23C 14/042 |
| 2008/0057850 A1 | 3/2008 | Park | |
| 2018/0039191 A1 * | 2/2018 | Shibazaki | G03F 9/7023 |
| 2018/0371604 A1 * | 12/2018 | Inoue | C23C 14/042 |
| 2019/0237710 A1 * | 8/2019 | Zhang | H01L 51/0021 |
| 2020/0321545 A1 * | 10/2020 | Wu | H01L 51/504 |
| 2021/0060700 A1 * | 3/2021 | Okamoto | B23K 26/22 |

FOREIGN PATENT DOCUMENTS

JP    2008-066269 A    3/2008

* cited by examiner

*Primary Examiner* — Tri T Ton
(74) *Attorney, Agent, or Firm* — ScienBiziP, P.C.

(57) ABSTRACT

Provided is a measuring device configured to measure an outer shape of a metal plate containing a magnetic body. The measuring device includes a stage on a front face of which the metal plate is set, a light source configured to radiate light toward the stage, an image acquisition unit configured to acquire an image of the metal plate, a plurality of magnetic force generation units configured to generate magnetic force on a back face side of the stage, and a controller configured to control positions at which the magnetic force is generated.

12 Claims, 4 Drawing Sheets

MEASURING DEVICE AND MEASURING METHOD

TECHNICAL FIELD

The disclosure relates to a measuring device and a measuring method configured to measure an outer shape of a metal plate containing a magnetic body.

BACKGROUND ART

In vapor deposition processing included in a manufacturing process of a display device (an organic EL display, an inorganic EL display, a QLED display, or the like), a mask sheet is typically used to control a vapor deposition pattern.

In vapor deposition processing included in a manufacturing process of a display device (organic EL, an inorganic EL display, a QLED display, or the like), a mask sheet is typically used to control a vapor deposition pattern.

In the mask sheet, a plurality of openings with a size of several micrometers are present aligned with pixels of the display device, and it is necessary to find whether there exists a shift in position of the openings and recognize the degree of the shift in position with respect to the design value. This measurement of the shift in position is referred to as pixel position accuracy (PPA) measurement.

In general, the PPA measurement is performed in the following procedure. First, the mask sheet is set on a stage. Next, four corners of the mask sheet are respectively gripped and pulled by grippers provided in the four corners. Then, the mask sheet is photographed with a camera, and the PPA is measured.

The film thickness at the inside of an active area (pixel area) differs from the film thickness at the outside thereof in the mask sheet. The film thickness is thin inside the active area formed by chemical etching. Because of this, wrinkles and/or waviness (hereinafter simply referred to as "wrinkles") may be generated in the active area. The presence of the wrinkles makes it difficult to accurately measure the PPA. As such, the mask sheet is pulled to smooth out the wrinkles, and thereafter the PPA is measured.

JP 2008-66269 A discloses a configuration in which a mask sheet is pulled by a gripper.

SUMMARY

However, the known method described above has the following problems.

Gripping the mask sheet with the gripper leaves a gripper mark in the mask sheet. When the mask sheet is stretched and welded to a frame after an inspection process, the mask sheet is pulled with a three stronger than a force received in the inspection process. As a result, the mask sheet is cut in some case where the gripper mark serves as the starting point. In addition, depending on the alignment conditions of the mask sheet prior to the PPA measurement, a larger tension is generated in the mask sheet than that in the stretching process and/or the welding process after the inspection.

Furthermore, pulling the mask sheet may also cause problems such as (1) the active area with a thin film thickness is damaged, (2) a shift in position of the active area occurs, and (3) openings in the active area are expanded. In such cases, it is difficult to accurately measure the outer shape of the mask sheet.

The disclosure has been conceived in view of the above problems, and an object thereof is to achieve a measuring device and a measuring method, which are able to more accurately measure an outer shape of a metal plate containing a magnetic body.

Solution to Problem

In order to solve the above problems, a measuring device according to the isclo sure is a measuring device configured to measure an outer shape of a metal plate containing a magnetic body, and the stated measuring device is configured to include a stage on a front face of which the metal plate is set; a light source configured to radiate light toward the stage; an image acquisition unit configured to acquire an image of the metal plate; a plurality of magnetic force generation units configured to generate magnetic force on a back face side of the stage; and a controller configured to control positions at which the magnetic force is generated.

According to the above-described configuration, the metal plate containing the magnetic body and the magnetic force generation units attract each other by the magnetic force at the positions at which the magnetic force is generated, so that the metal plate is fixed (temporarily fixed) to the stage. Then, in a state in which the metal plate is fixed to the stage, the controller controls the positions at which the magnetic force is generated, thereby making it possible to stretch the metal plate by the magnetic force. With this, wrinkles and/or waviness generated in the metal plate, for example, may be reduced. As a result, the measuring device is able to more accurately measure the outer shape of the metal plate.

Furthermore, according to the configuration described above, an end portion of the metal plate is not required to be gripped by grippers or the like in order to stretch the metal plate, and thus no gripper marks are left in the metal plate. Accordingly, in a process after the measurement of the outer shape of the metal plate, the metal plate will not be cut from the gripper mark serving as the starting point.

In order to solve the problems described above, a measuring method according to the disclosure is a measuring method for measuring an outer shape of a metal plate containing a magnetic body, and the method includes, in sequence, (a) setting the metal plate on a front face of a stage; (b) generating magnetic force on the front face; (c) controlling a position at which the magnetic force is generated; and (d) acquiring an image of the metal plate.

According to the above-described cont guration, the same effects may be achieved as the above-described measuring device.

Advantageous Effects of Disclosure

According to an aspect of the disclosure, it is possible to achieve a measuring device and a measuring method, which are able to more accurately measure an outer shape of a metal plate.

DESCRIPTION OF EMBODIMENTS

First Embodiment

Basic Configuration of Measuring Device 100

Figure 1:
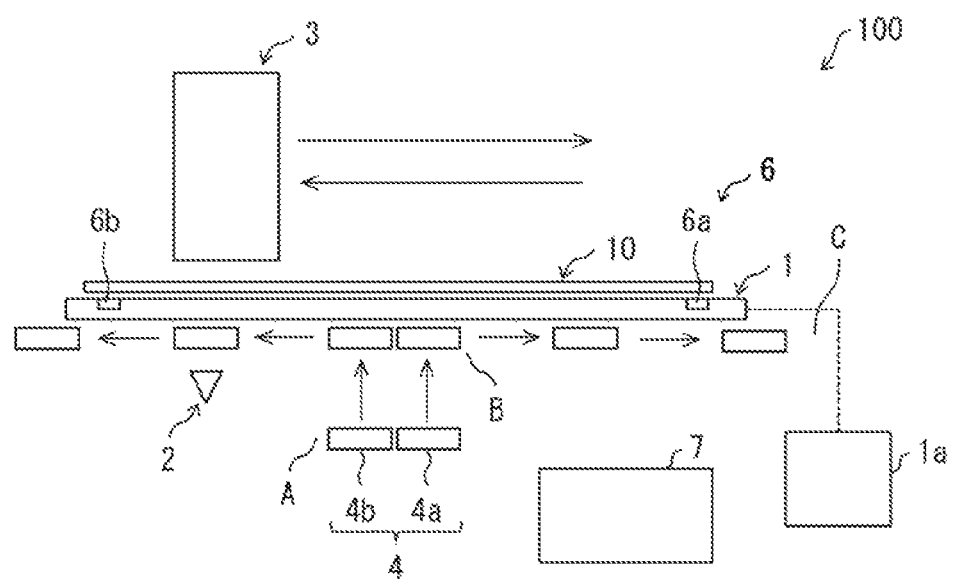
FIG. 1 is a schematic diagram of a measuring device according to the present embodiment.

With reference to the drawings including FIG. 1, or the like, an embodiment of the disclosure will be described below. FIG. 1 is a schematic diagram of a measuring device 100 according to the present embodiment.

The measuring device 100 is a device configured to measure a shift in position of a mask sheet 10. In the following description, the measurement of the shift in position of the mask sheet 10 is referred to as "pixel position accuracy (PPA) measurement".

The measuring device 100 includes a stage 1, a lamp 2, a camera (image acquisition unit) 3, a movement magnet (second magnetic force generation unit; second magnet) 4, a fixed magnet (first magnetic force generation unit; first magnet) 6, and a movement magnet controller (controller) 7.

The stage 1 is a stage, on the surface of which the mask sheet 10 to be subjected to the PPA measurement is set. The stage 1 has transparency, and transmits light radiated from the lamp 2. The stage 1 is made of glass, for example. The surface of the stage 1 is a planar face. The stage 1 is configured to be movable under control by a stage drive unit (drive unit) 1*a*. The stage drive unit 1*a* may be installed inside or outside of the stage 1.

The mask sheet 10 is a metal plate containing a magnetic body and is used to deposit particles on a plurality of pixels of the display device. The mask sheet 10 may be a fine metal mask (FMM), a common metal mask (CMM), or the like.

The lamp 2 is a light source configured to radiate light toward the stage 1. The lamp 2 is disposed on a lower side of the stage 1. The lamp 2 is, for example, an LED lamp, but another light sources may be used. The lamp 2 is so configured as to be able to radiate light toward the stage 1 from any of a lower direction, an upper direction, and a lateral direction of the stage 1.

The camera 3 captures an image of the mask sheet 10 set on the front face of the stage 1. In the mask sheet 10, there exist a plurality of openings with a size of several micrometers being aligned with the pixels of the display device. The camera 3 is used to measure the degree of a shift in position of each of the plurality of openings with respect to the design value. It is sufficient for the camera 3 to have resolution sufficient for the PPA measurement, so that a camera used for known PPA measurement may be used.

In FIG. 1, the camera 3 is disposed on the upper side of the stage 1. However, the camera 3 may be disposed at other locations. For example, when the lamp 2 is disposed on the upper side of the stage 1, the camera 3 is provided on the lower side of the stage 1. In this way, the camera 3 may be positioned in relation to the lamp 2. The camera 3 is configured to be movable in such a manner as to be able to capture the image of the mask sheet 10 from any of the lower direction, upper direction, and lateral direction of the stage 1.

The fixed magnet 6 temporarily fixes the mask sheet 10 on the stage 1. Alternatively, the fixed magnet 6 fixes the mask sheet 10 on the stage 1. Specifically, the fixed magnet 6 is disposed on the back face or in the interior of the stage 1, and attracts the mask sheet 10 containing the magnetic body. Two fixed magnets (a fixed magnet 6*a* and a fixed magnet 6*b*) are depicted in FIG. 1. There may be four fixed magnets 6 disposed at positions corresponding to four corners of the mask sheet 10. Alternatively, there may be any number of fixed magnets 6. The fixed magnet 6 may be replaced with an electromagnet to be described with reference to the drawings including FIG. 4. In this case, the generation of magnetic force of the electromagnet is controlled by a controller (not illustrated).

The movement magnet 4 moves on the back face side of the stage 1 under control by the movement magnet controller 7. As for the movement magnet 4, two movement magnets (a movement magnet 4*a* and a movement magnet 4*b*) are depicted in FIG. 1. However, one movement magnet 4, or multiple, to be specific, more than two movement magnets 4 may be present.

The movement method of the movement magnet 4 is not limited to a specific method. For example, the movement magnet 4 is disposed on a carriage, and the carriage moves, in response to the control by the movement magnet controller 7, on a predetermined route (not illustrated). In this case, when the movement magnet controller 7 instructs the carriage to move, the carriage moves on the predetermined route while mounting the movement magnet 4 thereupon.

The method for moving the movement magnet 4 may be another method. For example, the movement magnet 4 may be manually moved. In this case, the movement magnet 4 is independent of the control by the movement magnet controller 7.

The predetermined route defines a route on which the carriage mounting the movement magnet 4 thereupon moves. Specifically, the predetermined route passes through, at least, a position A, a position B (first position), and a position C (second position).

The position A is a position that is set at the center of the back face of the stage 1 and is separated from the stage 1. At the position separated from the stage 1, the mask sheet 10 and the movement magnet 4 do not attract each other by magnetic force.

The position B is a position that is set at the center of the back face of the stage 1 and is close to the stage 1. The position close to the stage 1 is a position in contact with the stage 1 and/or a position at which the mask sheet 10 and the movement magnet 4 are able to attract each other by magnetic force.

The position C is a position that is set at an end portion of the back face of the stage 1 and is close to the stage 1. The end portion of the back face refers to a portion near a position where the fixed magnet 6 is provided, or a portion on the end portion side of the stage 1 further distanced from the position where the fixed magnet 6 is provided.

The predetermined route may be configured to circulate. In this configuration, the movement magnet 4 moves from the position A to the position B and position C, and then returns to the position A.

An example in which the movement magnet controller 7 controls the position of the movement magnet 4 with the mask sheet 10 temporarily fixed to the stage 1 by the fixed magnet 6, will be described below.

First, the movement magnet 4 is positioned at the position A. When the movement magnet 4 is at the position A, the mask sheet 10 does not receive the magnetic force of the movement magnet 4.

Next, the movement magnet controller 7 makes the movement magnet 4 move from the position A to the position B. When the movement magnet 4 is at the position B, the mask sheet 10 receives the magnetic force of the movement magnet 4.

Next, the movement magnet controller 7 makes the movement magnet 4 move from the position B to the position C. During the movement magnet 4 moving from the position B to position C, the mask sheet 10 continues to receive the magnetic force of the movement magnet 4. By the effect of the magnetic force, wrinkles and/or waviness (hereinafter simply referred to as "wrinkles") present in the active area of the mask sheet 10 may be removed or reduced.

As described above, the position C is near the position where the fixed magnet 6 is provided, or is on the end portion side of the stage 1 further distanced from the position where the fixed magnet 6 is provided. Therefore, the wrinkles present in the active area of the mask sheet 10 may be more reduced than in a case where movement of the movement magnet 4 is stopped at a position on the center side of the stage 1 relative to the position where the fixed magnet 6 is provided.

In the case where the predetermined route is configured to circulate, the movement magnet controller 7 may make the movement magnet 4 move from the position A to position C a plurality of times, in the sequence of the position A, position B, position C, position A, position B, and position C. This makes it possible to more reduce the wrinkles present in the active area of the mask sheet 10 than in a case where the movement magnet 4 moves only once from the position A to the position B and position C.

The movement magnet controller 7 receives an external signal, and makes the movement magnet 4 move forward, move backward, or stop in accordance with the external signal.

Figure 2:
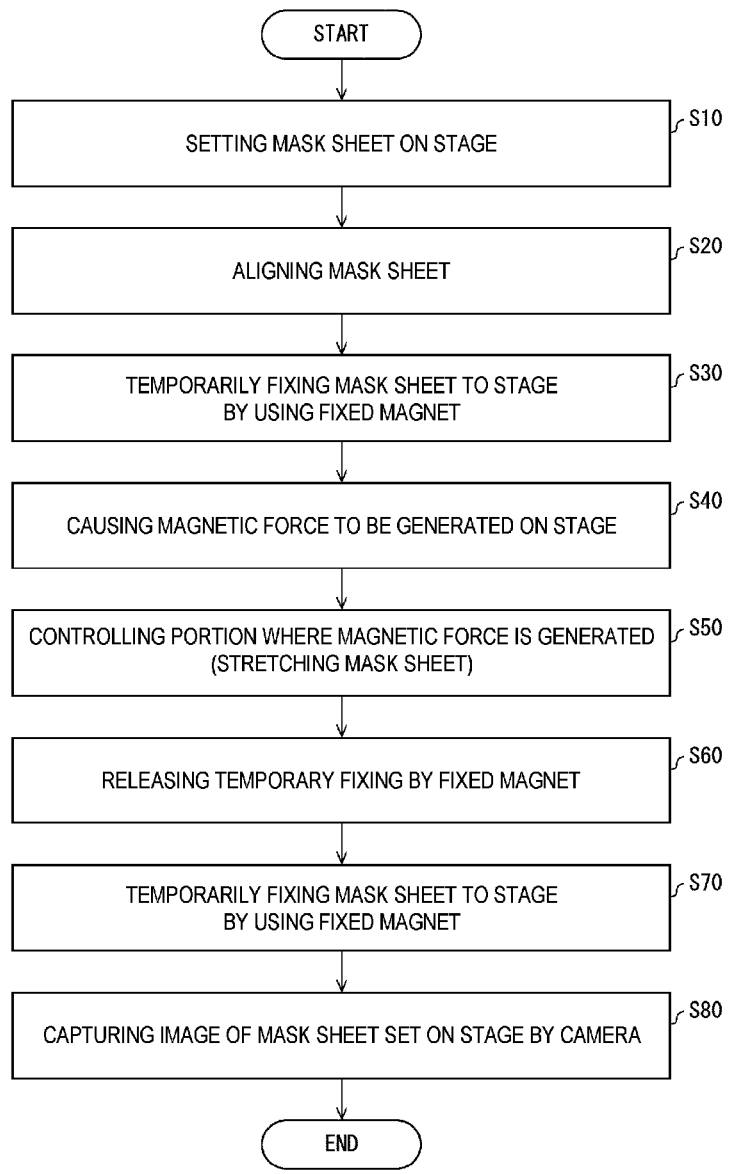
FIG. 2 is a flowchart for reducing wrinkles contained in a mask sheet according to the present embodiment.

The method for reducing the wrinkles by using the movement magnet 4 will be described in more detail below with reference to FIG. 2. FIG. 2 is a flowchart for reducing the wrinkles contained in the mask sheet 10 by using the movement magnet 4.

First, the mask sheet 10 is set on the stage 1 (S10). Next, the mask sheet 10 is aligned (positioned) (S20). Next, the mask sheet 10 is temporarily fixed to the stage 1 by using the fixed magnet 6 (S30). Next, the movement magnet controller 7 makes the movement magnet 4 move from the position A to the position B, and causes magnetic force to be generated on the stage 1 (S40). Subsequently, the movement magnet controller 7 makes the movement magnet 4 move from the position B to the position C. With this, the movement magnet controller 7 controls a position where the magnetic force is generated on the stage 1 (S50). Next, the temporary fixing by the fixed magnet 6 is released (S60). As a result, large wrinkles formed at the end portion of the mask sheet 10 are released. Next, the mask sheet 10 is temporarily fixed to the stage 1 again by using the fixed magnet 6 (S70). In S70, the mask sheet 10 set on the stage 1 is stretched. Finally, an image of the stretched mask sheet 10 is captured by the camera 3, and the PPA is measured (S80).

In the following, S30 to S70 will be described in more detail.

As described above, in S30, the mask sheet 10 is temporarily fixed to the stage 1 by the fixed magnet 6 (first temporary fixing). Then, in S40, the movement magnet 4 moves to the position B and generates the magnetic force on the stage 1.

Next, in S50, the movement magnet 4 moves from the position B to the position C. During the movement of the movement magnet 4, the mask sheet 10 continues to receive the magnetic force of the movement magnet 4. Due to the effect of the magnetic force, the wrinkles present in the center portion of the mask sheet 10 converge in a direction toward the end portion of the mask sheet 10 (a direction toward the position C) along with the movement of the movement magnet 4. In other words, while the wrinkles present in the center portion of the mask sheet 10 are stretched, large wrinkles are formed at the end portion of the mask sheet 10. When the wrinkles reach the end portion, the wrinkles generate a force trying to separate the temporarily fixed mask sheet 10 from the stage 1. By this force, the temporary fixing of the mask sheet 10 by the fixed magnet 6 is released, and as a result, the wrinkles are released (S60). Thereafter, the end portion of the mask sheet 10 returns to the stage 1 by its own weight. Then, the mask sheet 10 is temporarily fixed to the stage 1 again by the fixed magnet 6 (S70).

Thus, the first temporary fixing is released by utilizing the force of the wrinkles. However, the first temporary fixing may be released by temporarily moving the fixed magnet 6. Specifically, after the movement of the movement magnet 4 to the position C, the fixed magnet 6 is temporarily separated from the stage 1. As a result, the state in which the mask sheet 10 is temporarily fixed to the stage 1 is released (S60), and the large wrinkles formed at the end portion of the mask sheet 10 are released. The timing at which the fixed magnet 6 is separated from the stage 1 may be just before the movement magnet 4 moves to the position C, rather than after the movement magnet 4 has moved to the position C.

Next, the fixed magnet 6 is attached again to the stage 1 (S70). The position at which the fixed magnet 6 is attached is a position corresponding to the end portion of the mask sheet 10. With this, the mask sheet 10 is temporarily fixed again to the stage 1 (second temporary fixing). The large wrinkles, which were present at the end portion of the mask sheet 10, have been released by S60. Therefore, wrinkles formed in the mask sheet 10 are smaller in number at the time of the second temporary fixing than those at the time of the first temporary fixing.

The fixed magnet 6 is not required to firmly fix the mask sheet 10 to the stage 1 in the first temporary fixing and the second temporary fixing, so that the mask sheet 10 may be temporarily fixed lightly to the stage 1. In other words, it is sufficient for the fixed magnet 6 to temporarily fix the mask sheet 10 with a level of force that lightly attracts the mask sheet 10 in the direction toward the stage 1.

In the case where the predetermined route is configured to circulate as described above, the movement magnet controller 7 may make the movement magnet 4 move from the position A to position C a plurality of times, in the sequence of the position A, position B, position C, position A, position B, and position C. In this case, every time the movement magnet 4 moves to the position C, the wrinkles in the mask sheet 10 are released. Then, after the second temporary fixing is performed, the movement magnet 4 is made to move to the position A, position B, and position C. In this way, by repeating S60 and S70 every time the movement magnet 4 moves to the position C, the wrinkles in the mask sheet 10 may be further reduced.

In a case where wrinkles in the mask sheet 10 are sufficiently small in number, execution of S60 and S70 may be omitted. However, in order to more reliably reduce wrinkles in the mask sheet 10, S60 and S70 are preferably executed. Further, for example, in a case where the mask sheet 10 is temporarily fixed to the stage 1 at only one end portion (or one portion), the wrinkles are stretched in a direction toward the other end, which is a direction opposite to the direction toward the one end portion. With this, the releasing of the wrinkles of the mask sheet 10 by releasing the temporary fixing by the fixed magnet 6 and the temporarily fixing of the mask sheet 10 again, are both unnecessary.

Figure 3:
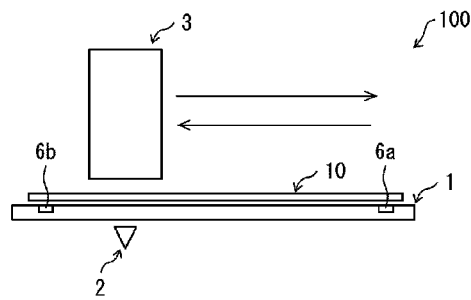
FIG. 3 is a diagram illustrating a state in which PPA measurement is performed on a mask sheet.

FIG. 3 is a diagram illustrating a state in which PPA measurement is performed on the mask sheet 10. In S50 (or S70) of FIG. 2, the mask sheet 10 is stretched on the stage 1. As a result, wrinkles present in the active area of the mask sheet 10 are smoothed out. That is, the measuring device 100 is able to measure the PPA in the same state as that in a case where the stretching is performed by using grippers.

As discussed above, the measuring device 100 operates the movement magnet 4 disposed under the stage 1 to smooth out the wrinkles, and measures the PPA while maintaining the state in which the wrinkles are smoothed out. This makes it possible for the measuring device 100 to enhance accuracy of the PPA measurement. At this time, the mask sheet 10 is not pulled by grippers. As a result, the mask sheet 10 can be prevented from the breakage originating from the gripper mark as the starting point.

MODIFIED EXAMPLE 1

In the above description, the measuring device 100 includes the plurality of fixed magnets 6. However, the measuring device 100 may be achieved in a configuration in which only one fixed magnet 6 is provided.

For example, the mask sheet 10 is formed in a rectangular shape, and the fixed magnet 6 is disposed at a portion corresponding to one corner of the four corners thereof. That is, the mask sheet 10 is temporarily fixed to the stage 1 at the above one corner.

On the other hand, there are a plurality of movement magnets 4. The plurality of movement magnets 4 move from the one corner toward the remaining three corners, respectively. Even with such configuration, wrinkles present in the active area of the mask sheet 10 may be reduced without using grippers.

MODIFIED EXAMPLE 2

In the above description, the measuring device 100 includes the plurality of movement magnets 4. However, the measurement device 100 may be achieved in a configuration in which only one movement magnet 4 is provided.

For example, the mask sheet 10 is formed in a rectangular shape, and the fixed magnets 6 are disposed at portions corresponding to the four corners respectively. That is, the mask sheet 10 is temporarily fixed to the stage 1 at the four corners.

At this time, the predetermined route is configured as follows. Specifically, in the predetermined route, the movement magnet 4 moves in the sequence of the position B, a first corner, the position B, a second corner, the position B, a third corner, the position B, and a fourth corner. This configuration may also reduce wrinkles present in the active area of the mask sheet 10.

A configuration in which the measuring device 100 includes one each of the movement magnet 4 and the fixed magnet 6 may also be achieved by combining Modified example 1 and Modified example 2.

Second Embodiment

Hereinafter, a configuration of another measuring device 110 will be described with reference to FIG. 4 to FIG. 8.

Basic Configuration of Measuring Device 110

Figure 4:
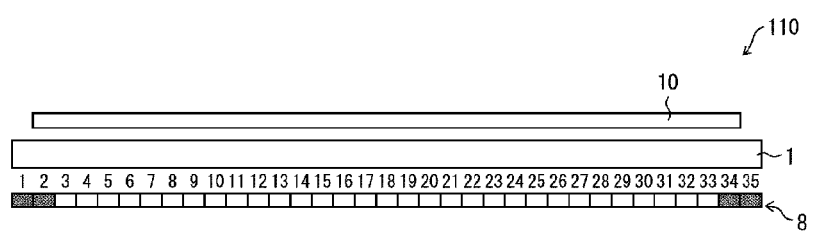
FIG. 4 is a diagram illustrating main portions of a measuring device according to another embodiment in which a first electromagnet 8 to an n-th electromagnet 8 are used.

FIG. 4 is a diagram illustrating main portions of the measuring device 110 in which a first electromagnet 8 to an n-th electromagnet 8 (n is an integer greater than 1) are used. For the sake of simplicity, members having the same functions as the members described in the foregoing embodiment will be given the same reference signs, and descriptions thereof will be omitted.

The measuring device 110 is a device configured to measure a shift in position of a mask sheet 10, The measuring device 110 includes a stage 1, a lamp 2 (not illustrated), a camera 3 (not illustrated), and the first electromagnet 8 to the n-th electromagnet 8.

Note that the measuring device 110 does not include the movement magnet 4, the fixed magnet 6, and the movement magnet controller 7. In FIG. 4 to FIG. 8, n is an integer of 2 to 35.

Each of the first electromagnet 8 to the n-th electromagnet 8 temporarily generates magnetic force when a current flows therethrough. The first electromagnet 8 to the n-th electromagnet 8 are disposed on the back face of the stage 1 in the modes as follows, for example: (1) a matrix shape, (2) a linear shape, (3) arrangement with gaps each provided between the adjacent electromagnets, (4) arrangement without gaps each provided between the adjacent electromagnets, and (5) random arrangement. In the case where actions described below are performed, the arrangement of the first electromagnet 8 to the n-th electromagnet 8 is not limited to the above (1) to (5).

Next, the actions of the first electromagnet 8 to the n-th electromagnet 8 will be described by referring to FIG. 4 to FIG. 8. In the following, the first electromagnet 8, the second electromagnet 8, the 34th electromagnet 8, and the 35th electromagnet 8 (each also referred to as an "end portion electromagnet") respectively correspond to end portions of the mask sheet 10. The third electromagnet 8 to the 33rd electromagnet 8 (each also referred to as a "center portion electromagnet") respectively correspond to a center portion of the mask sheet 10. Note that these are for the sake of convenience in explanation. Accordingly, for example, it may be understood that the first electromagnet 8 to the third electromagnet 8, and the 33rd electromagnet 8 to the 35th electromagnet 8 respectively correspond to the end portions of the mask sheet 10, and that the fourth electromagnet 8 to the 32nd electromagnet 8 respectively correspond to the center portion of the mask sheet 10.

In FIG. 4, a first current flows through each of the first electromagnet 8, second electromagnet 8, 34th electromagnet 8, and 35th electromagnet 8, whereby first magnetic force is generated. As a result, the mask sheet 10 and each of the first electromagnet 8, second electromagnet 8, 34th electromagnet 8, and 35th electromagnet 8 attract each other by the magnetic force, whereby the corresponding portions (end portions) of the mask sheet 10 are temporarily fixed to the stage 1. This applies to FIG. 5 to FIG. 7 to be described below.

Figure 5:
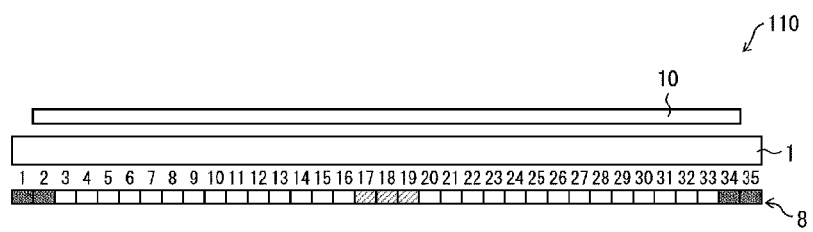
FIG. 5 is a diagram for describing actions of a measuring device according to another embodiment in which the first electromagnet 8 to the n-th electromagnet 8 are used.

FIG. 5 is a diagram for describing the actions of the measuring device 110 in which the first electromagnet 8 to the n-th electromagnet 8 are used. In FIG. 5, (1) the first current flows through each of the first electromagnet 8, second electromagnet 8, 34th electromagnet 8, and 35th electromagnet 8, whereby the first magnetic force is generated, and (2) a second current flows through each of the 17th electromagnet 8 to 19th electromagnet 8, whereby second magnetic force is generated. The second current is larger in size than the first current. The second magnetic force is larger in magnitude than the first magnetic force.

As a result, the mask sheet 10 and each of the 17th electromagnet 8 to 19th electromagnet 8 attract each other by the magnetic force, whereby the corresponding portions (center portion) of the mask sheet 10 are fixed (temporarily fixed) to the stage 1.

Figure 6:
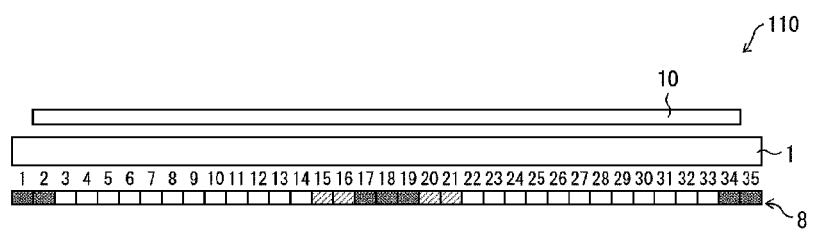
FIG. 6 is a diagram for describing actions of a measuring device according to another embodiment in which the first electromagnet 8 to the n-th electromagnet 8 are used.

FIG. 6 is a diagram for describing the actions of the measuring device 110 in which the first electromagnet 8 to the n-th electromagnet 8 are used. In FIG. 6, (1) the first current flows through each of the first electromagnet 8, the second electromagnet 8, the 34th electromagnet 8, the 35th electromagnet 8, and the 17th electromagnet 8 to 19th electromagnet 8, whereby the first magnetic force is generated. Further, in FIG. 6, (2) the second current flows through each of the 15th electromagnet 8, 16th electromagnet 8, 20th electromagnet 8, and 21st electromagnet 8, whereby the second magnetic force is generated.

That is, in a process of changing from the state of FIG. 5 to the state of FIG. 6, the value of the current flowing through each of the 17th electromagnet 8 to the 19th electromagnet 8 is decreased from the second current to the first current, and the magnetic force is decreased from the second magnetic force to the first magnetic force. The value of the current flowing through each of the 15th electromagnet 8, 16th electromagnet 8, 20th electromagnet 8, and 21st electromagnet 8 increases from 0 to the second current, and the magnetic force increases from 0 to the second magnetic force. In this way, the wrinkles present in the active area of the mask sheet 10 corresponding to the positions of the 15th electromagnet 8 to the 21st electromagnet 8, may be efficiently smoothed out.

In the above description, it is explained that each of the 17th electromagnet 8 to the 19th electromagnet 8 is supplied with the first current. However, it is not absolutely necessary for each of the 17th electromagnet 8 to 19th electromagnet 8 to be supplied with the first current, as long as a current smaller in size than the second current flows therethrough.

Figure 7:
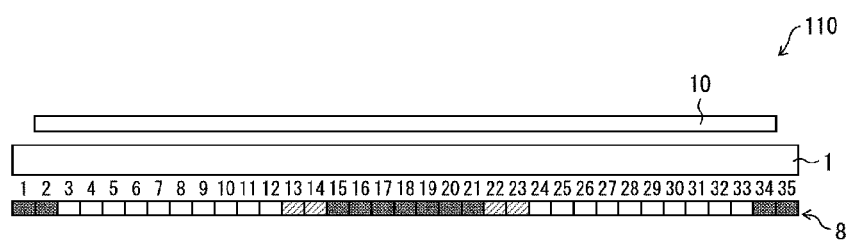
FIG. 7 is a diagram for describing actions of a measuring device according to another embodiment in which the first electromagnet 8 to the n-th electromagnet 8 are used.

FIG. 7 is a diagram for describing the actions of the measuring device 110 in which the first electromagnet 8 to the n-th electromagnet 8 are used. In FIG. 7, (1) the first current flows through each of the first electromagnet 8, the second electromagnet 8, the 34th electromagnet 8, the 35th electromagnet 8, and the 15th electromagnet 8 to 21st electromagnet 8, whereby the first magnetic force is generated. Further, in FIG. 7, (2) the second current flows through each of the 13th electromagnet 8, 14th electromagnet 8, 22nd electromagnet 8, and 23rd electromagnet 8, whereby the second magnetic force is generated.

That is, in a process of changing from the state of FIG. 6 to the state of FIG. 7, a state in which the first current is flowing through each of the 17th electromagnet 8 to 19th electromagnet 8 is maintained. The value of the current flowing through each of the 15th electromagnet 8, 16th electromagnet 8, 20th electromagnet 8, and 21st electromagnet 8 decreases from the second current to the first current, and the magnetic force decreases from the second magnetic force to the first magnetic force. The value of the current flowing through each of the 13th electromagnet 8, 14th electromagnet 8, 22nd electromagnet 8, and 23rd electromagnet 8 increases from 0 to the second current, and the magnetic force increases from 0 to the second magnetic force. In this way, the wrinkles present in the active area of the mask sheet 10 corresponding to the positions of the 13th electromagnet 8 to the 23rd electromagnet 8, may be efficiently smoothed out.

In the above description, it is explained that each of the 15th electromagnet 8 to the 21st electromagnet 8 is supplied with the first current. However, it is not absolutely necessary for each of the 15th electromagnet 8 to 21st electromagnet 8 to be supplied with the first current, as long as a current smaller in size than the second current flows therethrough.

Figure 8:
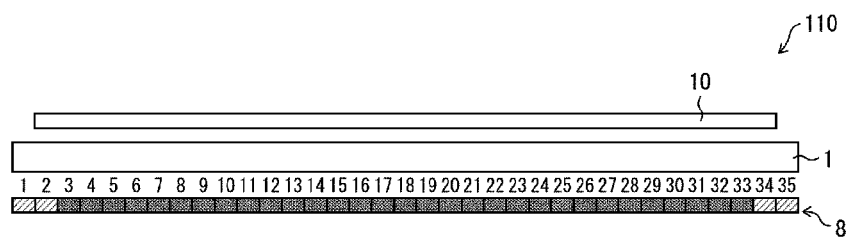
FIG. 8 is a diagram for describing actions of a measuring device according to another embodiment in which the first electromagnet 8 to the n-th electromagnet 8 are used.

FIG. 8 is a diagram for describing the actions of the measuring device 110 in which the first electromagnet 8 to the n-th electromagnet 8 are used. In FIG. 8, (1) the second current flows through each of the first electromagnet 8, second electromagnet 8, 34th electromagnet 8, and 35th electromagnet 8, whereby the second magnetic force is generated, and (2) the first current flows through each of the third electromagnet 8 to 33rd electromagnet 8, whereby the first magnetic force is generated. This makes it possible to efficiently smooth out the wrinkles present in the active area of the mask sheet 10. Finally, the second current flows through the first electromagnet 8, second electromagnet 8, 34th electromagnet 8, and 35th electromagnet 8, so that the mask sheet 10 is fixed to the stage 1 while the wrinkles being smoothed out.

As discussed above, the measuring device 110 is able to efficiently reduce wrinkles present in the active area of the mask sheet 10 by changing the values of the currents flowing through the first electromagnet 8 to the n-th electromagnet 8, whose positions are fixed. Since the measuring device 110 has the above-described configuration, the movement magnet 4, the fixed magnet 6, and the movement magnet controller 7 are not needed. The control of power supply to the first electromagnet 8 to the n-th electromagnet 8 may be carried out by a controller (not illustrated).

As described above, the first electromagnet 8 to the n-th electromagnet 8 may be arranged in various ways. Advantages of each arrangement will be described below.

When the first electromagnet 8 to the n-th electromagnets 8 are arranged in a matrix shape, the process of smoothing out wrinkles present in the active area of the mask sheet 10 is precisely controlled.

When the first electromagnet 8 to the n-th electromagnet 8 are arranged in a linear shape, it is possible to easily arrange the first electromagnet 8 to the n-th electromagnet 8, and simplify the process of smoothing out the wrinkles.

When the first electromagnet 8 to the n-th electromagnet 8 are arranged with gaps each provided between the adjacent electromagnets, light radiated from the lamp 2 passes through the gaps. This makes it possible for the camera 3 to clearly capture an image of the mask sheet 10.

In addition, depending on the arrangement of the first electromagnet 8 to the n-th electromagnet 8, a configuration in which the light of the lamp 2 is radiated from a lateral side of the stage 1 is also conceivable. As discussed above, the measuring device 110 is able to flexibly change the overall configuration thereof.

The measuring device 100 and the measurement device 110 have been described thus far. The effects obtained by the measuring device 100 and the measuring device 110 are prominent as compared to a known method utilizing negative pressure to fix a mask sheet to a stage (hereinafter referred to as an "air adsorption type"). The air adsorption type needs to be provided with a plurality of fine adsorption holes in the stage. Because of this, the air adsorption type has problems such as (1) locations at which the mask sheet is adsorbed to the stage are limited to the adsorption holes, (2) an adsorption fault occurs when foreign matters enter the adsorption holes, and (3) the air adsorption type is difficult to perform maintenance.

In contrast, the measuring device 100 and the measuring device 110 do not have the above-described problems (1) to (3) because there is no need to be provided with adsorption holes. Further, in the measuring device 100 and the measuring device 110, unlike the air adsorption type, the front face of the stage 1 can be made to be a planar face. Accordingly, in the measuring device 100 and the measuring device 110, the stage 1 can be easily processed and manufactured.

Application

The measuring device and the measuring method according to the present embodiment are configured to measure the outer shape of the mask sheet 10 for vapor-depositing particles on a plurality of pixels. The stated mask sheet 10 is used in the following (1) to (3), for example. Accordingly, the measuring device and the measuring method according to the present embodiment may be suitably applied to the manufacture of display units such as the following (1) to (3).

(1) An organic electro luminescence (EL) display including an organic light emitting diode (QLED) as an electro-optical element (2) An inorganic EL display including an inorganic light emitting diode as an electro-optical element (3) A quantum dot light emitting diode (QLED) display including a QLED as an electro-optical element, and the like Supplement A measuring device according to a first aspect of the disclosure is a measuring device configured to measure an outer shape of a metal plate containing a magnetic body, and the device is configured to include a stage on a front face of which the metal plate is set; a light source configured to radiate light toward the stage; an image acquisition unit configured to acquire an image of the metal plate; a plurality of magnetic force generation units configured to generate magnetic force on a back face side of the stage; and a controller configured to control positions at which the magnetic force is generated.

According to the above-described configuration, the metal plate containing the magnetic body and the magnetic force generation units attract each other by the magnetic force at the positions at which the magnetic force is generated, so that the metal plate is fixed (temporarily fixed) to the stage. Then, in a state in which the metal plate is fixed to the stage, the controller controls the positions at which the magnetic force is generated, thereby making it possible to stretch the metal plate by the magnetic force. With this, wrinkles and/or waviness generated in the metal plate, for example, may be reduced. As a result, the measuring device is able to more accurately measure the outer shape of the metal plate.

Furthermore, according to the configuration described above, an end portion of the metal plate is not required to be gripped by grippers or the like in order to stretch the metal plate, and thus no gripper marks are left in the metal plate. Accordingly, in a process after the measurement of the outer shape of the metal plate, the metal plate will not be cut from the gripper mark serving as the starting point.

A measuring device according to a second aspect of the disclosure is such that, in the above-described first aspect, the plurality of magnetic force generation units include one or a plurality of first magnetic force generation units and one or a plurality of second magnetic force generation units different from the first magnetic force generation units. The one first magnetic force generation unit or the plurality of first magnetic force generation units are fixed to the stage, and temporarily fix an end portion of the metal plate to the stage. The controller controls the positions at which the magnetic force is generated by moving the one second magnetic force generation unit or the plurality of second magnetic force generation units from a first position corresponding to a center portion of the metal plate toward a second position corresponding to an end portion of the metal plate on a back side of the stage. The measuring device according to the second aspect of the disclosure may be achieved by such configuration.

According to the above-described configuration, the metal plate may be efficiently stretched.

A measuring device according to a third aspect of the disclosure may be configured such that, in the second aspect, the one first magnetic force generation unit or the plurality of first magnetic force generation units, and the one second magnetic force generation unit or the plurality of second magnetic force generation units are each a magnet.

According to the above-described configuration, a measuring device exhibiting the above effects may be achieved with a simple configuration.

A measuring device according to a fourth aspect of the disclosure may be configured such that, in the first aspect, the plurality of magnetic force generation units are respectively a plurality of electromagnets fixed to the back face side of the stage, and the controller controls the positions at which the magnetic force is generated, by power supply to the plurality of electromagnets.

According to the above-described configuration, the controller is able to easily control the positions at which the magnetic force is generated.

A measuring device according to a fifth aspect of the disclosure may be configured such that, in any one of the first to fourth aspects, the metal plate is a mask sheet for vapor-depositing particles on a plurality of pixels of a display unit.

According to the configuration described above, the measuring device is able to suitably measure an outer shape of a mask sheet used in an organic EL display provided with an OLED, an inorganic EL display provided with an inorganic light emitting diode, a QLED display provided with a QLED, and the like.

A measuring device according to a sixth aspect of the disclosure may be configured such that, in any one of the first to fifth aspects, the stage includes a drive unit configured to drive the stage.

According to the above-described configuration, after the metal plate is stretched, the metal plate can be easily positioned by driving the stage.

A measuring device according to a seventh aspect of the disclosure may be configured such that, in any one of the first to sixth aspects, the front face of the stage is a planar face.

According to the configuration described above, the measuring device does not have the problem that the disclosure air adsorption type has. Furthermore, with the above measuring device, the stage may be easily processed and manufactured.

A measuring method according to an eighth aspect of the disclosure is a measuring method for measuring an outer shape of a metal plate containing a magnetic body, and the method includes, in sequence, (a) setting the metal plate on a front face of a stage; (b) generating magnetic force on the front face; (c) controlling a position at which the magnetic force is generated; and (d) acquiring an image of the metal plate.

A measuring method according to a ninth aspect of the disclosure may be a method such that, in the eighth aspect, the metal plate is a mask sheet for vapor-depositing particles on a plurality of pixels of a display unit.

A measuring method according to a tenth aspect of the disclosure is such that, in the eighth or ninth aspect, the method further includes, in sequence between (a) the setting of the metal plate on the front face of the stage and (b) the generating of the magnetic force on the front face, (a1) positioning the metal plate and (a2) temporarily fixing the metal plate by using one or a plurality of first magnets. In (c) the controlling of the position at which the magnetic force is generated, the position at which the magnetic force is generated is controlled by moving one or a plurality of second magnets different from the one first magnet or the plurality of first magnets, from a first position corresponding to a center portion of the metal plate toward a second position corresponding to an end portion of the metal plate on a back face side of the stage. The measuring method according to the tenth aspect of the disclosure may be achieved by such method.

A measuring method according to an eleventh aspect of the disclosure is such that, in the eighth or ninth aspect, in a case where a plurality of electromagnets are disposed covering an area from a first position corresponding to a center portion of the metal plate to a second position corresponding to an end portion of the metal plate on a back face side of the stage, the method further includes, in sequence between (a) the setting of the metal plate on the front face of the stage and (b) the generating of the magnetic force on the front face, (a1) positioning the metal plate and (a2) temporarily fixing the metal plate by power supply to a plurality of end portion electromagnets disposed at positions corresponding to the end portion of the metal plate among the plurality of electromagnets. In (c) the controlling of the position at which the magnetic force is generated, the position at which the magnetic force is generated is controlled by sequentially supplying power to a plurality of center portion electromagnets, among the plurality of electromagnets, disposed at positions corresponding to the center portion of the metal plate in a direction from the first position toward the second position. The measuring method according to the eleventh aspect of the disclosure may be achieved by such a method.

A measuring method according to a twelfth aspect of the disclosure may be such that, in the eleventh aspect, in (c) the controlling of the position at which the magnetic force is generated, of currents to be supplied to each of the plurality of center portion electromagnets, a second current is supplied first and a first current smaller in size than the second current is supplied subsequently.

A measuring method according to a thirteenth aspect of the disclosure may be such that, in the twelfth aspect, after (c) the controlling of the position at which the magnetic force is generated, the current supplied to the plurality of end portion electromagnets is larger in size than the current supplied to the plurality of center portion electromagnets.

The disclosure is not limited to each of the embodiments described above, and various modifications may be made within the scope of the claims. Embodiments obtained by appropriately combining technical approaches disclosed in each of the different embodiments also fall within the technical scope of the disclosure.

The invention claimed is:

1. A measuring device configured to measure an outer shape of a metal plate containing a magnetic body, the measuring device comprising:
   a stage on a front face of which the metal plate is set;
   a light source configured to radiate light toward the stage;
   a plurality of magnets configured to generate magnetic force received by the metal plate on a back face side of the stage;
   a camera configured to acquire an image of the metal plate that receives the magnetic force; and
   a controller configured to control positions at which the magnetic force is generated,
   wherein the controller controls the positions at which the magnetic force is generated by moving at least one of the plurality of magnets from a center portion of the metal plate toward an end portion of the metal plate on the back face side of the stage.

2. The measuring device according to claim 1,
   wherein the plurality of magnets includes one or a plurality of first magnets and one or a plurality of second magnets different from the first magnets,
   the one first magnet or the plurality of first magnets is fixed to the stage, and fixes an end portion of the metal plate to the stage, and
   the controller controls the positions at which the magnetic force is generated by moving the one second magnet or the plurality of second magnets from a first position corresponding to the center portion of the metal plate toward a second position corresponding to the end portion of the metal plate on the back face side of the stage.

3. The measuring device according to claim 1,
   wherein the plurality of magnets is respectively a plurality of electromagnets fixed to the back face side of the stage, and
   the controller controls the positions at which the magnetic force is generated, by power supply to the plurality of electromagnets.

4. The measuring device according to claim 1,
   wherein the metal plate is a mask sheet for vapor-depositing particles on a plurality of pixels of a display unit.

5. The measuring device according to claim 1,
   wherein the stage includes a drive unit configured to drive the stage.

6. The measuring device according to claim 1,
   wherein the front face of the stage is a planar face.

7. A measuring method for measuring an outer shape of a metal plate containing a magnetic body, the method comprising:
   in sequence,
   (a) setting the metal plate on a front face of a stage;
   (b) generating magnetic force on the front face;
   (c) controlling a position at which the magnetic force received by the metal plate is generated; and
   (d) acquiring an image of the metal plate that receives the magnetic force,
   wherein in (c), the position at which the magnetic force is generated is controlled by moving one or a plurality of magnets from a center portion of the metal plate toward an end portion of the metal plate on a back face side of the stage.

8. The measuring method according to claim 7,
   wherein the metal plate is a mask sheet for vapor-depositing particles on a plurality of pixels of a display unit.

9. The measuring method according to claim 7, further comprising:
 in sequence between (a) the setting of the metal plate on the front face of the stage and (b) the generating of the magnetic force on the front face,
 (a1) positioning the metal plate; and
 (a2) temporarily fixing the metal plate by using one or a plurality of first magnets among the plurality of magnets that is present,
 wherein in (c) the controlling of the position at which the magnetic force is generated, the position at which the magnetic force is generated is controlled by moving one or a plurality of second magnets among the plurality of magnets that is present, the plurality of second magnets different from the one first magnet or the plurality of first magnets, from a first position corresponding to the center portion of the metal plate toward a second position corresponding to the end portion of the metal plate on the back face side of the stage.

10. The measuring method according to claim 7, in a case where a plurality of electromagnets are disposed as the plurality of magnets that is present, covering an area from a first position corresponding to the center portion of the metal plate to a second position corresponding to the end portion of the metal plate on the back face side of the stage, the method further comprising:
 in sequence between (a) the setting of the metal plate on the front face of the stage and (b) the generating of the magnetic force on the front face,
 (a1) positioning the metal plate; and
 (a2) temporarily fixing the metal plate by power supply to a plurality of end portion electromagnets disposed at positions corresponding to the end portion of the metal plate among the plurality of electromagnets,
 wherein in (c) the controlling of the position at which the magnetic force is generated, the position at which the magnetic force is generated is controlled by sequentially supplying power to a plurality of center portion electromagnets, among the plurality of electromagnets, disposed at positions corresponding to the center portion of the metal plate in a direction from the first position toward the second position.

11. The measuring method according to claim 10, wherein in (c) the controlling of the position at which the magnetic force is generated, of currents to be supplied to each of the plurality of center portion electromagnets, a second current is supplied first and a first current smaller in size than the second current is supplied subsequently.

12. The measuring method according to claim 11, wherein after (c) the controlling of the position at which the magnetic force is generated, the current supplied to the plurality of end portion electromagnets is larger in size than the current supplied to the plurality of center portion electromagnets.

\* \* \* \* \*